(12) United States Patent
Bao

(10) Patent No.: US 7,767,998 B2
(45) Date of Patent: Aug. 3, 2010

(54) OFETS WITH ACTIVE CHANNELS FORMED OF DENSIFIED LAYERS

(75) Inventor: Zhenan Bao, Millburn, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1457 days.

(21) Appl. No.: 10/727,709

(22) Filed: Dec. 4, 2003

(65) Prior Publication Data

US 2005/0121728 A1 Jun. 9, 2005

(51) Int. Cl.
*H01L 35/24* (2006.01)
(52) U.S. Cl. .................. 257/40; 257/E39.007
(58) Field of Classification Search .......... 257/40
See application file for complete search history.

(56) References Cited

U.S. PATENT DOCUMENTS

| | | | |
|---|---|---|---|
| 5,546,889 A * | 8/1996 | Wakita et al. ............... 117/84 |
| 5,574,291 A * | 11/1996 | Dodabalapur et al. ...... 257/40 |
| 6,555,411 B1 | 4/2003 | Bao et al. |
| 6,596,569 B1 | 7/2003 | Bao et al. |
| 6,661,024 B1 | 12/2003 | Zhang et al. |
| 6,713,389 B2 * | 3/2004 | Speakman ............... 438/674 |
| 6,777,529 B2 * | 8/2004 | Ong et al. ............... 528/373 |
| 6,905,906 B2 | 6/2005 | Sirringhaus et al. |
| 6,946,676 B2 | 9/2005 | Kelley et al. |
| 7,132,680 B2 | 11/2006 | Afzali-Ardakani et al. |
| 2003/0211665 A1 | 11/2003 | Bao et al. |

FOREIGN PATENT DOCUMENTS

| EP | 0 460 242 A | 12/1991 |
|---|---|---|
| EP | 1 355 323 A | 10/2003 |
| WO | WO 03/056641 A | 7/2003 |

OTHER PUBLICATIONS

Jan Genzer and Kiril Efimenko; "Creating Long Lived Superhydrophobic Polymer Surfaces Through Mechanically Assembled Monolayers"; Science vol. 290, 15 Dec. 2000; pp. 2130-2133.

J. Collet, S. Lenient, D. Vuillaume; O. Bouloussa, F. Rondelez, J.M Gay, K. Kham and C. Chevrot; "High Anisotropic Conductivity in Organic Insulator/Semiconductor Monolayer Heterostructure"; 2000 American Institute of Physics; Applied Physics Letters, vol. 76, No. 10, 6 Mar. 2000; pp. 1339-1341.

X. Linda Chen, Andrew J. Lovinger, Zhenan Bao and Joyce Sapjeta; "Morphological and Transistor /Studies of Organic Molecular Semiconductors With Anisotropic Electrical Characteristics"; 2001 American Chemical Society, Chem. Mater. 2001, 13; pp. 1341-1348.

(Continued)

*Primary Examiner*—Wai-Sing Louie
(74) *Attorney, Agent, or Firm*—Hitt Gaines PC

(57) ABSTRACT

The present invention provides apparatus and a method of fabricating the apparatus. The apparatus includes a substrate having a surface and an organic field-effect transistor (OFET) located adjacent the surface of the substrate. The OFET comprising a gate, a channel, a source electrode, and a drain electrode. The channel comprises a densified layer of organic molecules with conjugated multiple bonds, axes of the organic molecules being oriented substantially normal to the surface.

11 Claims, 6 Drawing Sheets

OTHER PUBLICATIONS

Guofeng Xu, Zhenan Bao and John T. Groves: "Langmuir-Blodgett Films of Regioregular Poly (3-Hexylthiophene) As Field-Effect Transistors"; 2000 American Chemical Society, Langmuir 2000, 16, pp. 1834-1841.

Karl R. Amundson, B. Joyce Sapjeta, Andrew J. Lovinger, Zhenan Bao; An In-Plane Anistrophic Semiconductor Based Upon Poly (3-Hexyl Thiophene); Elsevier Science B.V., Thin Solid Films 414 (2002); pp. 143-149.

H. Sirringhaus. R.J. Wilson, R.H. Friend. M. Inbasekaran, W. Su, E.P. Woo, M. Grail and D.D.C. Bradley; "Mobility Enhancement in Conjugated Polymer Field-Effect Transistors Through Chain Alignment in a Liquid Crystalline Phase"; American Institute of Physics, Applied Physics Letters, vol. 77, No. 3; Jul. 17, 2000; pp. 406-408.

Raluca I. Gearba, Matthias Lehmann, Jeremy Levin, Dimitri A. Ivanov, Michel H. J. Koch, Joaquin Barbera, Michael G. Debije, Jorge Pins and Yves H. Goods; "Tailoring Discotic Mesophases: Collumnar Order Enforced With Hydrogen Bonds"; Advanced Materials 2003, 15, No. 19, Oct. 2; pp. 1614-1618.

Pearson et al. "Field-Effect Transistor Based on Organometallic Langmuir-Blodgett Film" Electronics Letters, IEE Stevenage, GB, vol. 29, No. 15, Jul. 22, 1993, pp. 1377.1378, XP000385679, ISSN: 0013-5194.

Yu-Tai Tao, et al. "Structure Evolution of Aromatic-Derivatized Thiol Monolayers on Evaporated Gold", Langmuir, vol. 13, No. 15 (1997), pp. 4016-4023.

David Halliday, et al.; Fundamentals of Physics, 7th Edition; Wiley Internation Edition IDSN 0-471-46509-7; p. 317.

\* cited by examiner the # OFETS WITH ACTIVE CHANNELS FORMED OF DENSIFIED LAYERS

TECHNICAL FIELD OF THE INVENTION

The present invention is directed, in general, to a method of manufacturing organic field effect transistors (OFET) and, more specifically, to methods of manufacturing OFETS having high mobility channels and the resulting OFET structure.

BACKGROUND OF THE INVENTION

There is an increasing interest in the use of organic field effect transistors (OFET) where an active channel of the transistor is made from an organic material. To be useful, the organic material must be capable of supporting a channel of holes or electrons when the device is switched on by applying a voltage to a gate associated with the channel. Moreover, the carrier or field effect mobility of the organic material must be sufficient to facilitate a large increase in conductivity between the source and drain when the device is on versus off.

The active channel in conventional OFETs is composed of organic molecules, such as polymers or oligomers, having conjugated bonds. For instance, overlap between pi-orbitals of adjacent organic molecules allows the channel to be conductive. In some cases, doping, by either removing (via oxidation) or inserting (via reduction) electrons into the organic molecule, can improve their conductivity. Approaches to improve the carrier mobility of the channel include hydrogen bonding columnar stacks of organic molecules together and preparing alignment layers for organic molecules on the substrate. Nevertheless, existing OFETs continue to have channel regions with low carrier mobility and hence poor sensitivity, due in part, because of the small difference in the drain current in the "on" versus "off" state.

Accordingly the present invention overcomes the disadvantages associated with prior art devices by providing an OFET having a channel whose carrier mobility is higher than previous OFETs and a method for the fabrication of such a device.

SUMMARY OF THE INVENTION

The present invention recognizes that the carrier mobility of the channel of existing OFETs is low because the density and the uniformity of linear organic molecules packed in the channel are inadequate. Increasing the density and uniformity of the organic molecules in the channel improves the carrier mobility of the channel. This, in turn, increases the conductivity of the channel and allows the manufacture of OFET devices with improved sensitivity.

One embodiment of the present invention provides an apparatus. The apparatus comprises a substrate having a surface and an organic field-effect transistor located adjacent the surface of the substrate. The transistor comprises a gate, a channel, a source electrode, and a drain electrode. The channel includes a densified layer of organic molecules with conjugated multiple bonds, axes of the organic molecules being oriented substantially normal to the surface.

In another embodiment, the invention further provides a method of making the organic field-effect transistor. The method provides a substrate and forms a channel for an organic field-effect transistor. Forming the channel includes expanding the substrate from an original configuration to increase a dimension of the substrate to an expanded dimension. A layer of organic molecules with conjugated multiple bonds is formed on the substrate while in the expanded dimension. The substrate is returned to substantially the original configuration.

BRIEF DESCRIPTION OF THE DRAWINGS

The invention is best understood from the following detailed description, when read with the accompanying FIGUREs. Various features may not be drawn to scale and may be arbitrarily increased or reduced for clarity of discussion. Reference is now made to the following descriptions taken in conjunction with the accompanying drawings, in which.

DETAILED DESCRIPTION

The present invention benefits from an understanding why the channel region of existing organic field-effect transistors (OFETs) are inadequate. Specifically, the organic molecules of the channel have low packing density and are not uniformly packed. Consequently, the performance of conventional OFETs suffer because the carrier mobility of their channels are poor. Moreover, prior to the present invention it was not recognized how the density or uniformity of packing of organic molecules could be increased. This failure is due, in part, to the fact that the traditional substrates used in OFETs, such as silicon or various plastics, are inelastic.

The present invention recognizes for the first time that the use of an elastic substrate provides a novel result-effective variable for increasing the density and uniformity of organic molecules that form the channel region of an OFET. The term substrate as used herein refers to any elastic material capable of resuming its original shape when a deforming or expanding force is removed. Forming a layer of organic molecules on the substrate while it is expanded allows a denser layer of organic molecules to form than previously obtainable. Moreover, the organic molecules are more densely packed without the need for hydrogen bonding between molecules to hold the molecules together. This advantageously allows a broader class of organic compounds to be used to form the channel. In addition to the added challenges in synthesizing such materials, molecules containing polar groups, such as H-bonding sites, tend to absorb moisture more readily, thereby leading to more rapid device failure due to corrosion and shorting.

In addition, the compressive force associated with returning the substrate to its original configuration facilitates the alignment of the organic molecules in one orientation. Furthermore, the more uniform orientation of the organic molecules can be achieved without the added technical complications of preparing an alignment layer on the substrate surface. Conventional alignment layers typically involve a rubbed surface with grooves and ridges, which can disrupt charge carrier transport in the direction perpendicular to the rubbing direction. For instance, a friction-transferred Teflon™ alignment layer has such a low surface energy that most solvents can not wet this surface properly, which in turn, leads to non-uniformity in film formation.

A denser and more uniformly packed layer of organic molecules is advantageous because the charge transfer characteristics of the layer of organic molecules depends on the density and uniform orientation of the organic molecules, which generally each have one or more conjugated bonds, to form a system of conjugated bonds. The efficiency of charge transfer from one organic molecule to another increases as the distance between the conjugated bonding system of adjacent organic molecules is decreased.

Figure 1:
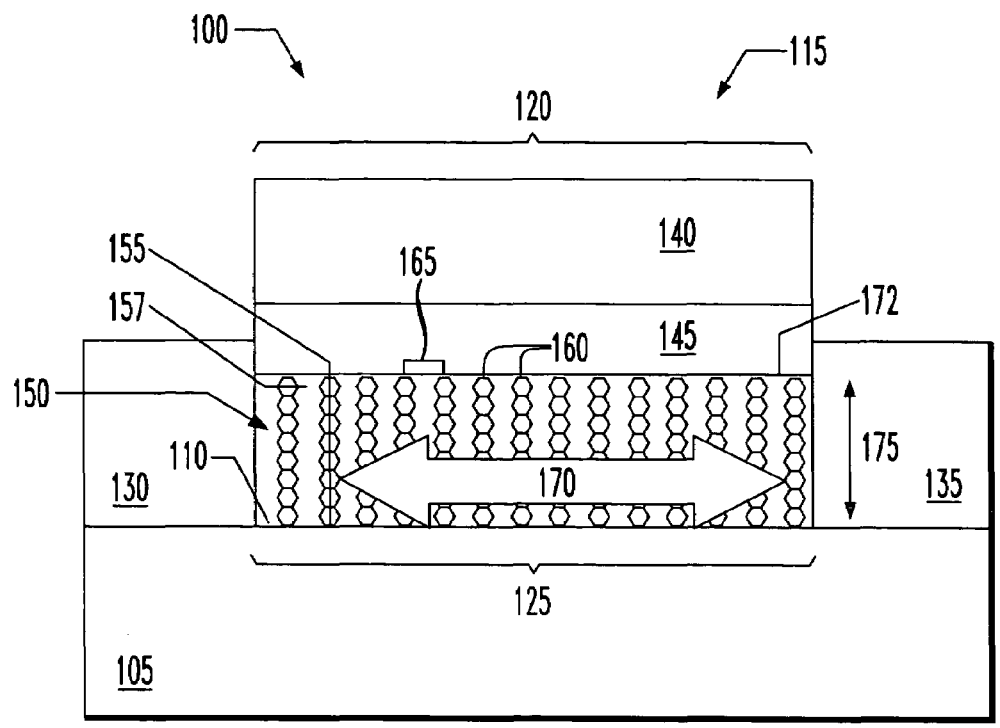
FIG. 1 schematically illustrates a detailed sectional view of an apparatus of the present invention.

FIG. 1 illustrates a schematic representation of a portion of an exemplary apparatus 100 of the present invention. The apparatus 100 may be used in any number of applications, such as biosensors, integrated circuits, displays and memory devices. The apparatus includes a substrate 105 having a surface 110, such as polydimethyl siloxane (PDMS) and an organic field-effect transistor 115 located adjacent the surface 110 of the substrate 105. The transistor 115 comprises a gate 120, a channel 125, and source and drain electrodes 130, 135. The source and drain electrodes 130, 135 are made of metal, such as gold, or conductive organic polymer. The gate 120 includes a gate electrode 140 also can be made of gold, and a gate dielectric 145 composed of silicon or aluminum oxide. Other configurations of the OFET 115, well known to those of ordinary skill in the art, are within the scope of the present invention.

The channel 125 comprises a densified layer of organic molecules with conjugated multiple bonds 150, such as sexithiophene. Preferably, the long axes of the organic molecules 155 are oriented substantially normal (e.g., about 90 degrees) to the substrate's surface 110. Of course, in other advantageous embodiments, a short axes 157 could be oriented substantially normal (e.g., about 90 degrees) to the substrate's surface 110.

Herein, a layer of organic molecules 150 is referred to as densified if the layer 150 is physically strained parallel to the substrate-surface 110 on which the layer 150 is formed. In a densified layer 150, the strain is a force of expansion that results from an over-density of organic molecules. A densified layer 150 has a strain, because the molecular over-density has not relaxed to a lower value that would be found in a bulk layer of the same composition. The densified layer 150 is too thin for complete relaxation of the strain, which is caused by the over-density of molecules at the substrate-surface. One way to form a densified layer of molecules 150 involves depositing the molecules on a stretched substrate 105 and then, allowing the substrate 105 to unstretch. Such a process can produce an over-density of molecules that would not have occurred if the layer had been formed directly on an unstretched substrate.

Preferably, the densified layer of organic molecules 150 has a surface density of at least about 7 molecules/nm$^2$. It is also preferable that adjacent organic molecules 160 of the densified layer 150 have an average separation distance 165 of less than about 3.8 Angstroms, and more preferably, less than about 3.5 Angstroms. For adjacent organic molecules 160 having conjugated pi bonds, the average separation distance 165 refers to the distance between the pi bonds.

As noted above, it is advantageous for the organic molecules of the densified layer 150 to have a uniform orientation because this improves charge mobility. A uniform orientation is indicated by the polarization ratio of greater than about one. The polarization ratio is defined as the ratio of transmitted light of one polarization to transmitted light with a perpendicular polarization. Polarization optical spectroscopy procedures for measuring the polarization ratio are well known to those skilled in the art, and therefore need not be described here. See e.g., Chen, X. L., Lovinger, A. J., et al., J., Chem. Mater. 13, 1341 (2001); Xue, G., et al., Langmuir 16, 1834 (2000); Amundson, K. R., et al. Thin Solid Film 414, 143 (2002); Sirringhaus H., et al., Appl. Phys. Lett. 77, 406 (2002), which are incorporated by reference herein in their entirety.

Preferably, the polarization ratio of the densified layer of organic molecules 150 is greater than about one, and even more preferably greater than about 2. Even more preferably, a direction of uniform orientation of the densified layer of organic molecules 150 is substantially coincident in a direction of current flow 170 between the source and drain electrodes 130, 135. In some embodiments, however, the current flow 170 perpendicular to the expanded direction can also have a higher charge carrier mobility, and therefore it is desirable to arrange the drain and source electrodes 130, 135, accordingly.

Numerous alternative embodiments of the apparatus 100 are within the scope of the present invention. The substrate 105 is preferably an elastomer that can be expanded to at least three times its original length and, once the exerted expanding force is released, the substrate 105 returns to substantially (e.g., within about 10 percent) its original length. Examples of suitable elastomers include polyisoprene, polybutadiene, polychloroprene, poly(ethylacrylate), polybutylmethacrylate or silicon rubbers. Preferred silicon rubbers include alkyl-substituted polysiloxanes such as PDMS. Preferably, the elastomeric substrate 105 has a glass transition temperature ($T_G$) of less than about 300° C. and more preferably, less than about 23° C.

In some advantageous embodiments of the apparatus 100, the organic molecules of the densified layer 150 have a conjugated pi system of bonds, although any semiconductive materials of organic molecules are within the scope of the present invention. Preferably, the organic molecules of the densified layer of 150 have an ordered crystalline or polycrystalline structure. The organic molecules can be any carbon containing compounds capable of forming a semiconducting densified layer 150. In some embodiments, the densified layer 150 is substantially free of organic molecules having chemical groups capable of hydrogen-bonding between adjacent organic molecules 160.

Preferably, the densified layer 150 has a field effect mobility of greater than about $10^{-4}$ cm$^2$ V$^{-1}$ s$^{-1}$. Even more preferably, the densified layer 150 has a field effect mobility of greater than about $10^{-4}$ cm$^2$ V$^{-1}$ s$^{-1}$, such as that provided by molecules having a conjugated pi system, as exemplified by poly- or oligothiophenes such as alpha-sexithiophene. In other advantageous embodiments, a ratio of the drain current of the OFET 115 when a voltage is applied to the gate 120, versus no applied gate voltage, is at least about 10:1. For example, when the gate voltage of −100 V is applied for a p-channel organic semiconductor, the conductivity from source to drain 130, 135, in the densified layer 150, that is within about 50 Angstroms of an interface 172 between the gate dielectric 145 and densified layer 150, is at least about $10^6$ S cm$^{-1}$.

Preferred organic molecules of the densified layer 150 include polythiophene and oligothiophene. For the purposes of the present invention, an oligothiophene has between 2 and 100 repeating units of thiophene while polythiophene has greater than 100 repeating units of thiophene. Other semiconductive organic compounds, however, are also within the scope of the present invention. Nonlimiting examples include oligophenyl or polyphenyl compounds. The organic molecule of the densified layer 150 may also comprise combinations of different benzoid aromatic ring structures like benzene, napthalene or anthracene rings coupled to each other such as pentacene, nonbenzoid aromatic rings, heterocylic rings, such as thiophene, or copolymers of these structures, such as copoly(bithiophenefluorene).

Some preferred organic molecules of the densified layer 150 have substantially coplanar aromatic groups, as this facilitates denser and more uniform packing. The term substantially coplanar aromatic groups refers to at least two adjacent aromatic groups in an organic molecule having a twist angle of less than about 23 degrees between aromatic groups. For example, adjacent thiophene rings in alpha-sexithiophene have a twist angle of about 10 degrees, and therefore the thiophene rings are considered to be substantially coplanar. In contrast, the two fused benzene rings in a biphenyl structure have a twist angle of about 23 degrees, and therefore the benzene rings are not coplanar.

In some preferred embodiments, the organic molecules of the densified layer 150 are linear organic molecules because this also facilitates denser and more uniform packing. Examples of linear organic molecules include polythiophenes, oligothiophenes such as alpha-sexithiophene, or derivatives of thiophenes, such as copoly(bithiophene fluorene). In other embodiments, however, branched organic molecules or molecules with sidechains, such as oligothiophenes with alkyl chain substituted at the 3-positions of thiophenes, can be used.

The densified layer 150 may comprise a single molecular layer of the organic molecules or multiple layers of organic molecules. The densified layer 150 can have a thickness 175 of about 20 Angstroms or more. In some preferred embodiments, the densified layer 150 has a thickness 175 between about 2 and about 100 Angstroms. In certain embodiments, a thickness of less than about 5 Angstroms is preferred because the carriers are confined mostly within a channel that is within 50 Angstroms from the gate dielectric surface.

In some embodiments of the apparatus 100, it is preferable to covalently bond the organic molecules of the densified layer 150 to the substrate surface 110. Covalent attachment to the substrate 105 facilitates the production of a denser, more uniform layer 150. In some instances, the substrate surface 110 is functionalized to promote covalent attachment of organic molecules of the densified layer 150 to the substrate surface 110, as further described below. In such embodiments, it is advantageous to also functionalize the organic molecules of the densified layer 150 with trichlorosilanes or methyoxysilanes to facilitate covalent bonding to the stretched substrate. In other embodiments, however, the organic molecules of the densified layer 150 are simply deposited on the substrate surface without covalent attachment to the substrate 105.

Figure 2A:
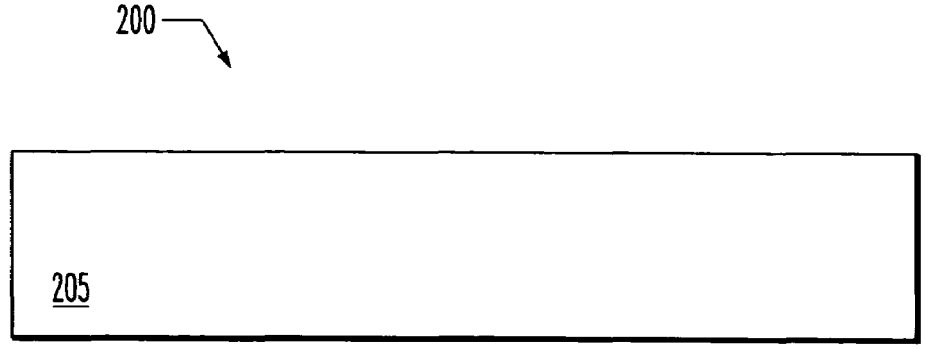
FIGS. 2A to 2G schematically illustrate detailed sectional views of a method of the present invention at selected stages of the method.
Figure 2B:
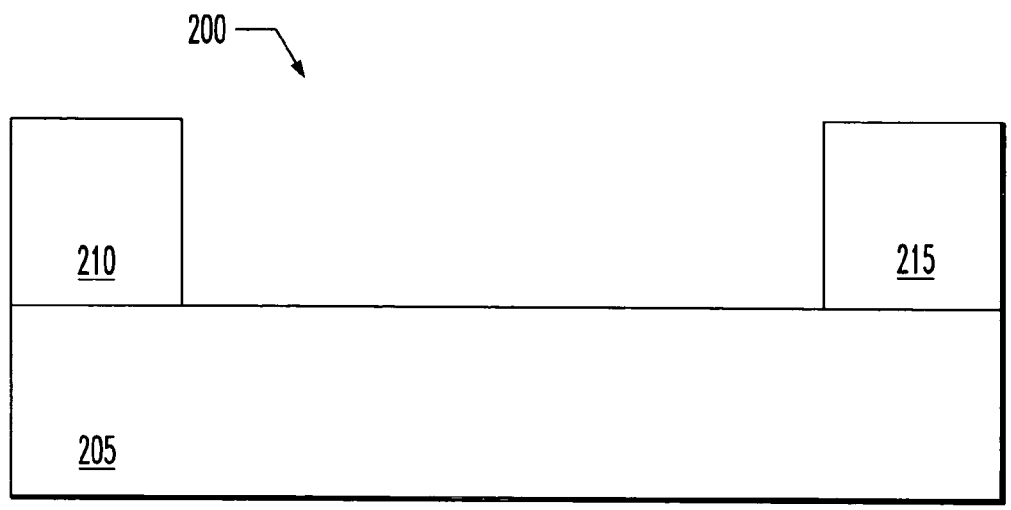

FIGS. 2A to 2G illustrate selected steps in an exemplary method of the present invention to form an OFET device 200. Turning first to FIG. 2A, the method includes providing a substrate 205 comprising, for example, PDMS or other materials as described above. Referring now to FIG. 2B, illustrated is the formation of source and drain electrodes 210, 215 over the substrate 205. Metal source and drain electrodes 210, 215, can be made of materials such as gold, silver, platinum, and palladium. Such materials can be deposited by conventional techniques like vacuum deposition, thermal evaporation or electron beam evaporation, followed by patterning via conventional lithographic processes to define the electrode structures 210, 215. Alternatively, source and drain electrodes 210, 215 can be made of conducting polymers, such as polyanilines or polythiophene, that can be doped to increase conductivity, or conductive ink, comprised of graphite and conducting polymers. Conventional techniques, such as ink jet printing, screen printing, or molding, can be used to form these source and drain electrode structures 210, 215.

Figure 2C:
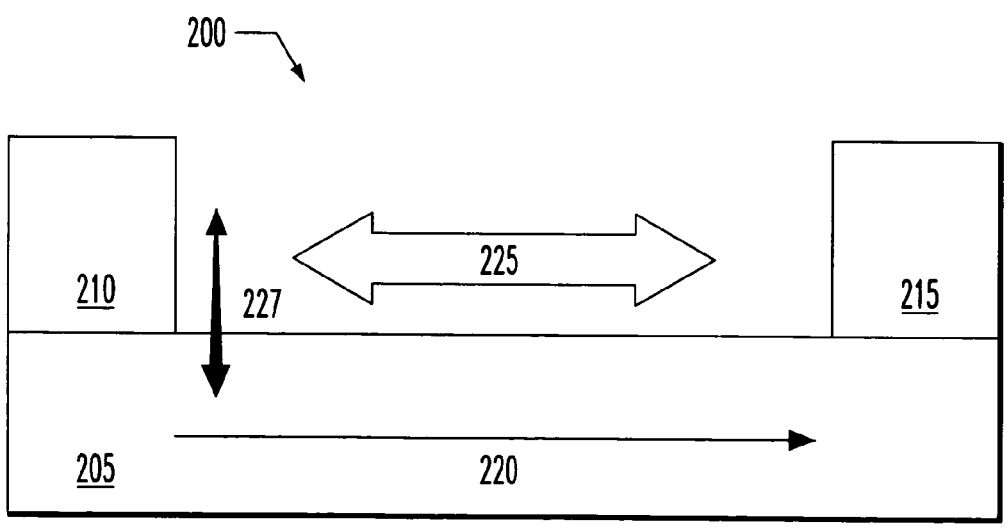

Referring now to FIG. 2C, the substrate 205 is expanded from its original configuration, such as shown in FIGS. 2A and 2B, to increase at least one dimension of the substrate 205 to an expanded dimension 220. For instance, the substrate can be expanded by at least about 10 percent, and more preferably, at least about 50 percent, as compared to its original configuration. The substrate 205 can be expanded by heating at least a portion of the substrate 205. As well-understood by those skilled in the art, certain materials suitable for use as a substrate 205 have large thermal expansion coefficients, and therefore, will expand upon heating. Alternatively, the whole substrate 205 can be heated, in which case, all three dimensions of the substrate 205 can be expanded simultaneously. Other methods can be used to expand the substrate. For example, certain substrates 205, such as PDMS, can be soaked in a solvent, such as hexane, to swell the substrate 205 in volume by about 100 percent or more.

Alternatively, the substrate 205 can be expanded by mechanically stretching a portion of the substrate 205 in the expanded dimension 220. Of course, the substrate 205 can be stretched in one, two or three dimensions. In some preferred embodiments, however, it is desirable to the stretch the substrate in one dimension 220, that is lateral to the long axes 155 of the organic molecules shown in FIG. 1. In some embodiments, for instance the substrate is stretched in a dimension 220 that is substantially coincident with a direction of intended current flow 225 between the source and drain electrodes 210, 215. Stretching in substantially the same direction as the intended current flow 225 advantageously facilitates the formation of a densified layer of organic molecules, with closer pi—pi bonding stacking, for example, as further discussed below. Alternatively, in other preferred embodiments, it is desirable to stretch the substrate lateral to the long axes 155 of the organic molecules and perpendicular to the direction of intended current flow 225 (arrow 227 coming out of the plane of the cross-section depicted in FIG. 2C). Stretching in substantially the perpendicular direction 227 as the intended current flow 225 is advantageous because of the more uniform orientation of the densified layer of organic molecules, which in turn, provides a higher charge carrier mobility in the current flow direction 225. If the substrate 205 has a $T_G$ of less than about 23° C., then stretching can be performed at room temperature. Alternatively, the substrate 205 can be heated to above its $T_G$, before stretching.

Figure 2D:
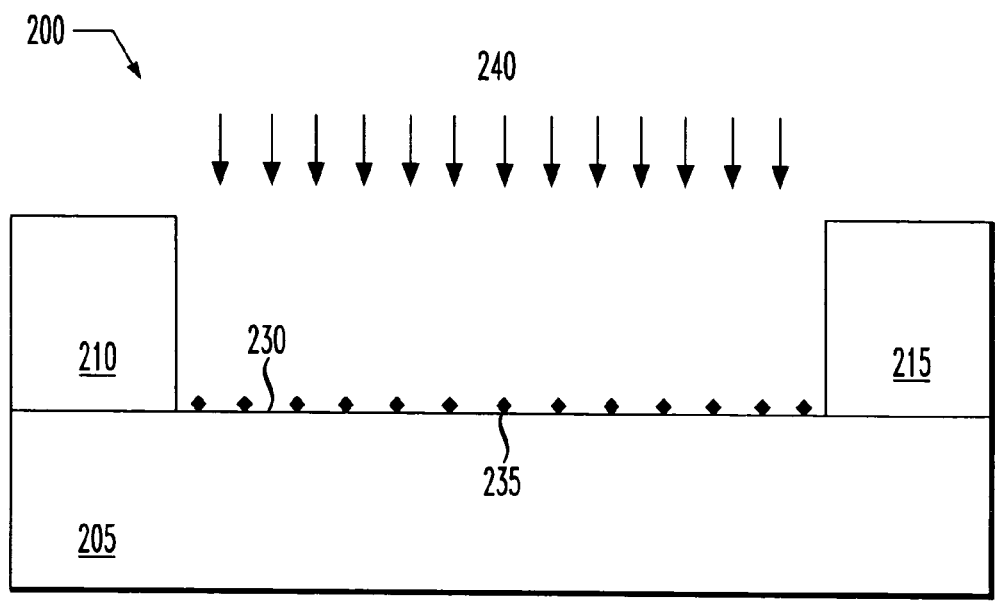

Next, as illustrated in FIG. 2D, a surface of the substrate 230 is modified to change the substrate's surface properties. Surface modification can advantageously promote the growth of the organic molecules on the substrate surface 230, and in some cases, facilitate the covalent bonding of organic molecules to the substrate 205, as discussed below. A modified surface can also promote the formation of a uniform layer of organic molecules via epitaxial growth of a self-assembling layer of organic molecules. As an example of surface modification, a PDMS substrate surface 230 can be altered to have silanol groups (—SiOH) 235, by exposure to an oxygen plasma, represented by arrows 240, for 1–2 seconds in a reactive ion etcher (Plama-Therm, Inc.) with a flow rate of 30 sccm and a pressure of 30 mTorr at 100 V. In other embodiments of the method, however, the substrate surface 230 is not modified.

Figure 2E:
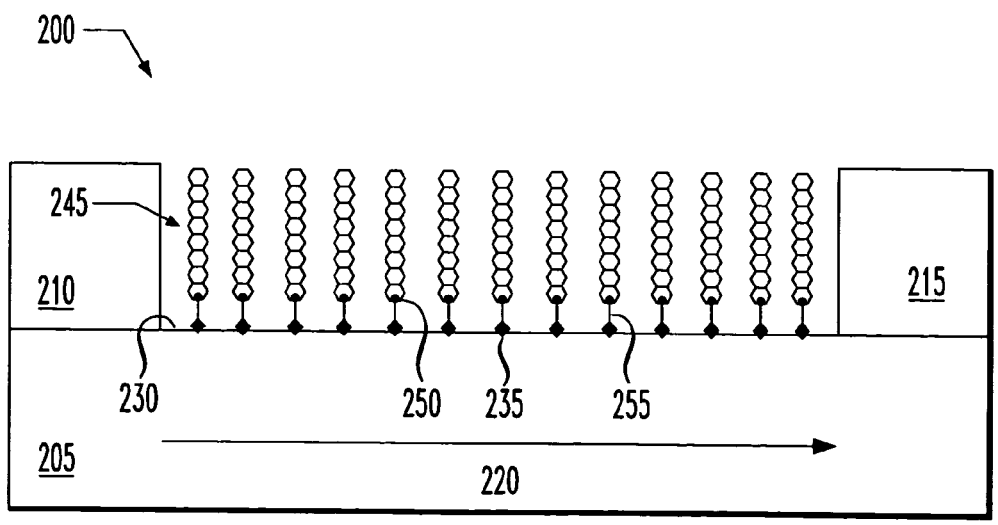

Turning now to FIG. 2E, illustrated is the formation of a layer of organic molecules having conjugated multiple bonds 245 on the substrate 205 while the substrate is in the expanded dimension 220. In the illustrated method, one end of the organic molecules 250 are covalently bonded to the substrate 205. Covalent bonding advantageously promotes the formation of a more densely and uniformly packed layer of organic molecules 245.

Consider, for example, the above-described PDMS substrate 205 whose surface 230 is modified with silanol groups 235. A trichlorosilane- and vinyl-terminated linker molecule 255, such as tetradecyl-1-enyl trichlorosilane, is covalently attached to the silanol groups 235. The vinyl groups are then oxidized by chemically generated ozone to carboxyl-groups. The carboxyl groups are then reacted with alcohol-terminated organic molecules 245 via an esterification reaction to covalently attach the organic molecules 245 to the substrate 205.

Of course, other methods, well known to those skilled in the art, can be used to covalently attach the organic molecules 245 to the substrate 205. See e.g., Collet J., et al., Appl. Phys. Lett. 76, 1339 (2000), which is incorporated by reference herein in its entirety. In other embodiments of the method, however, the organic molecules 245 are simply deposited on the modified or unmodified substrate 205 without covalent attachment, via vapor phase or solution deposition or other conventional processes. Although this approach has the advantage of requiring fewer processing steps than covalent attachment, in some case there is the potential for cracks to form in the film when the stretched substrate 205 is returned to its original configuration.

Figure 2F:
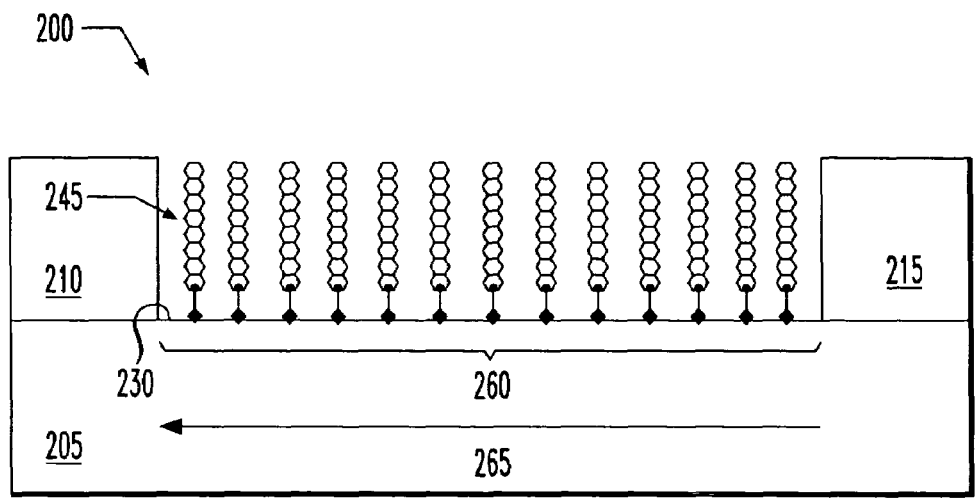

Referring now to FIG. 2F, illustrated is the device 200 after returning the substrate 205 to substantially its original configuration to form the channel region 260. Of course, one skilled in the art understands that the substrate 205 may not return to exactly the same dimensions it had before surface modification or covalently attaching the organic molecules 245 to the substrate's surface 230. For instance, the portion of the substrate 205 that is expanded in one or more dimension 220, after being relaxed, can vary from its original configuration by up to about 10 percent.

In some preferred embodiments, it is advantageous to return the substrate 205 to substantially the original configuration by relaxing the expanded dimension 220 in one direction 265. The compressive force associated with relaxing the substrate 205 in one direction 265 promotes a more densified or uniform organization of the organic molecules 245 in the same direction 265 as the compressive force. Even more preferably, relaxation to the original configuration is done in a direction 265 substantially coincident with a direction of current flow 225 between the source and drain electrodes 210, 215, as this improves the carrier mobility of the channel 260.

In certain preferred embodiments of the method, the OFET device 200 has a channel region 260 with a surface density of organic molecules 245 that is at least about 10 percent, and more preferably, at least about 50 percent greater, than a surface density of organic molecules that could be formed on the same substrate 205 when in an original non-expanded configuration.

Figure 2G:
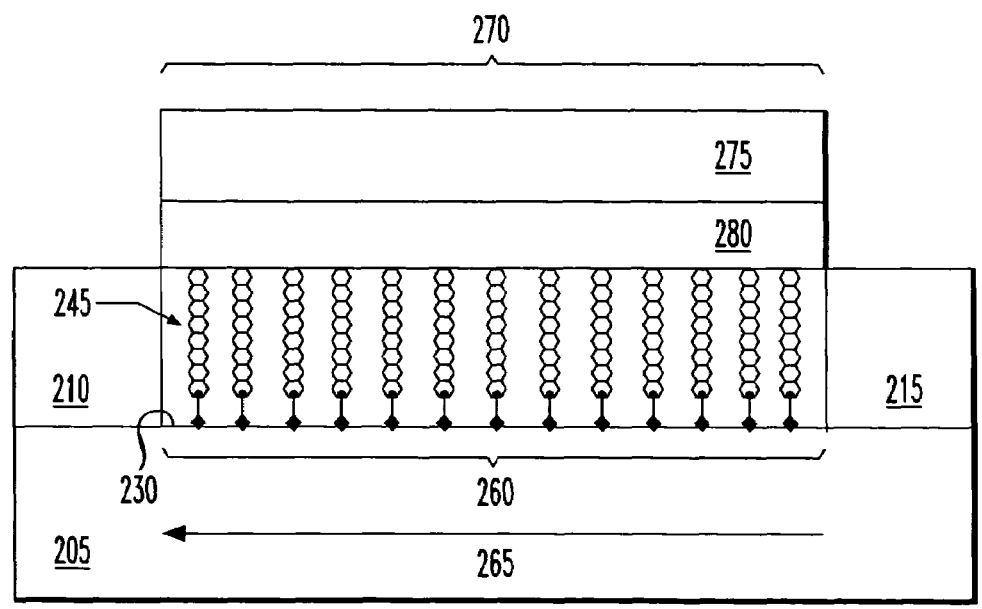

Turning now to FIG. 2G, illustrated is the OFET 200 after forming a gate 270. The gate 270, comprises a gate electrode 275 and gate dielectric 280. The gate dielectric 280 can be formed by depositing an inorganic layer, such as silicon oxide or aluminum oxide thermally evaporated over the substrate 205. Alternatively, the gate dielectric 280 can be formed by spin-coating insulating organic polymers or organic polymer/inorganic composites, or by chemical vapor deposition of monomer or organic polymers, such as poly-para-Xylylenes like parylene, on the substrate 205. As an example, polymers such as polyimide or polymethylmethacrylate can be deposited alone or in combination with titanium nanoparticles that serve to increase the dielectric constant of the gate dielectric 280. See e.g., U.S. patent application Ser. No. 10/700,651, by Howard E. Katz et al., filed Nov. 4, 2003, incorporated herein in its entirety. The gate electrode 275 can be comprised of the same materials and formed using the similar processes as described above for the source and drain electrodes 210, 215. Of course, the gate electrode 275 can be formed from different materials and by different processes, than those used to form the source and drain electrodes 210, 215.

Of course, alternative process flows of the method are apparent to those skilled in the art. In some embodiments, for instance, it is desirable to expand the channel region 260 before forming other components, such as the source and drain electrodes 210, 215. This advantageously avoids unnecessarily subjecting device components to stretching and relaxation forces that could deleteriously affect their structure or function.

Figure 3A:
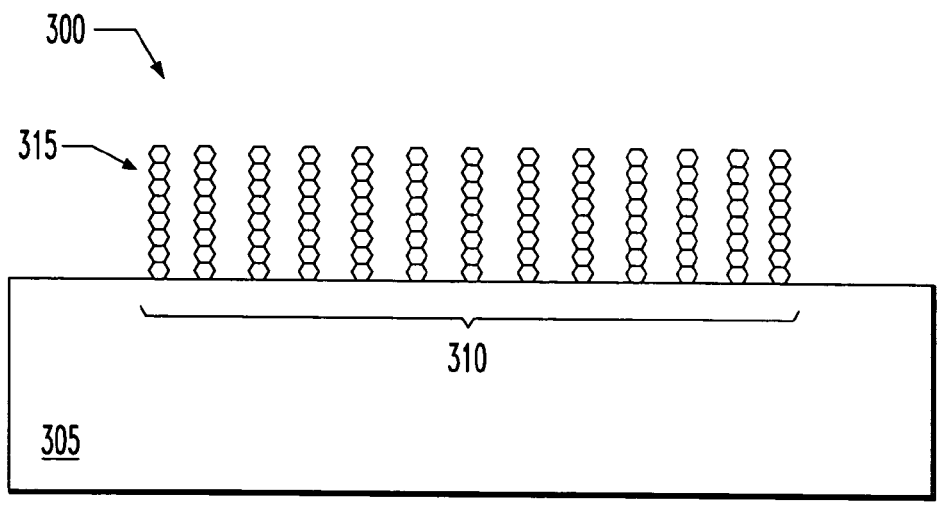
FIGS. 3A to 3C schematically illustrate detailed sectional views of an alternative method of the present invention at selected stages of the alternative method.
Figure 3B:
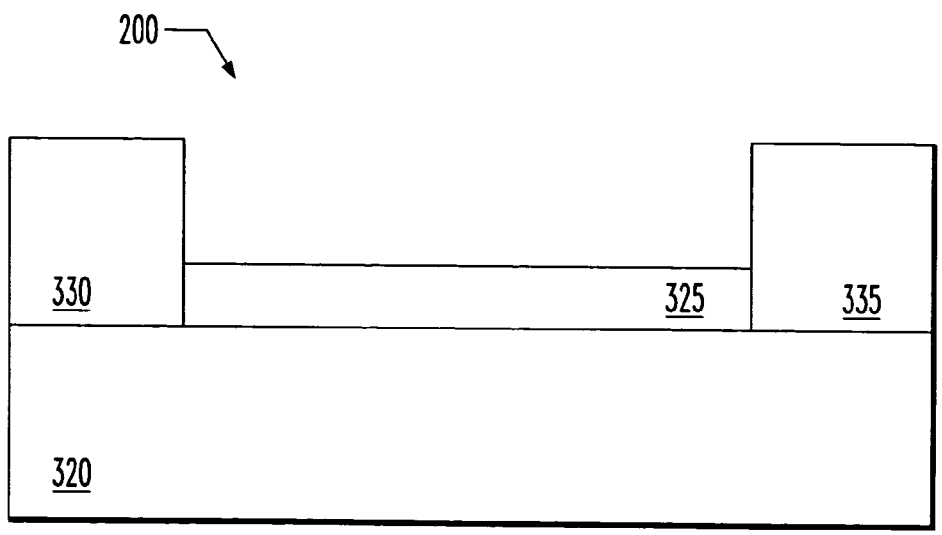
Figure 3C:
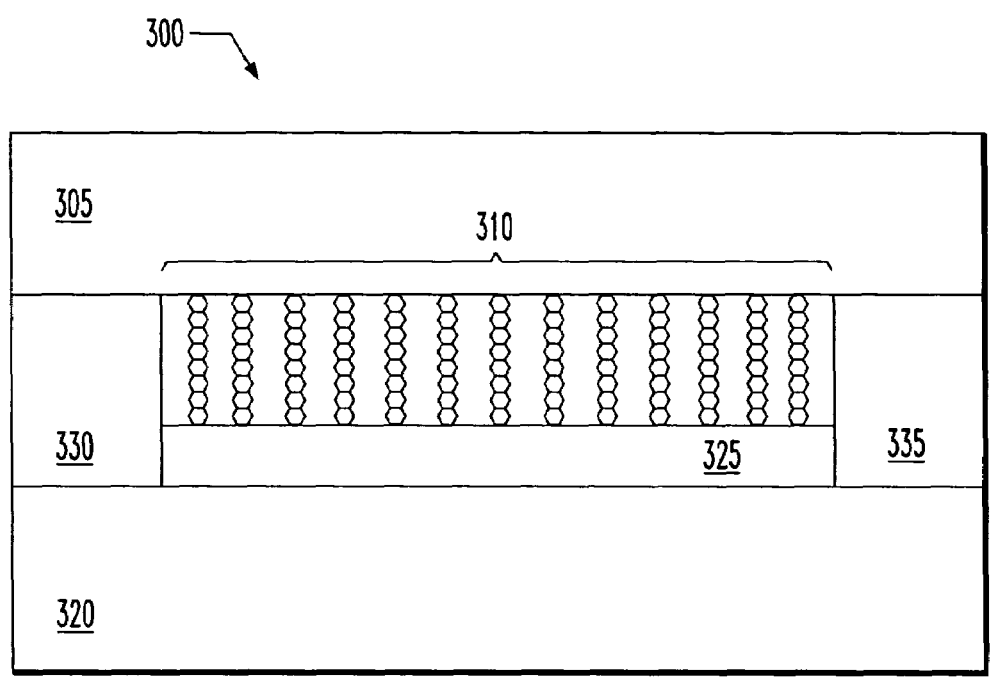

FIGS. 3A to 3C illustrate selected steps in yet another method to form an OFET device 300 according to the principles of the present invention. Turning first to FIG. 3A, shown is a first substrate 305, upon which is formed a channel 310 of an OFET 300 that comprises a densified layer of organic molecules 315 with conjugated multiple bonds. Any of the above-discussed methods and organic molecules can be used to form the channel 310.

Referring now to FIG. 3B, illustrated is a second substrate 320 upon which is formed a gate 325, a source electrode 330, and a drain electrode 335 of the organic field-effect transistor 300. Any of the above-discussed methods and materials can be used to form these components. In some embodiments, however, the second substrate 320 preferably comprises an inelastic material, such as plastic or silicon. Such materials are advantageous because of their low cost, general availability and familiarity of use in semiconductor device fabrication.

Forming device components such as the gate 325 and source and drain electrodes 330, 335 on a substrate 320 that is not expanded has a number of benefits. Similar to that noted above for another embodiment, these components are not subjected stretching and relaxation forces that could deleteriously affect their structure or function. In addition, the fabrication of different device components on different substrates allows these fabrication steps to be performed in parallel instead of sequentially, thereby allowing a faster manufacturing process.

Turning now to FIG. 3C, illustrated is the device 300 after positioning the channel 310 between the source and drain electrode 330, 335 and proximate the gate 325 by coupling the first and second substrates 305, 320 together. Any number of conventional techniques for laminating the first and second substrate 305, 320 can be used. See e.g., U.S. Pat. No. 6,596,569, incorporated by reference herein in its entirety.

Although the present invention has been described in detail, those of ordinary skill in the art should understand that they can make various changes, substitutions and alterations herein without departing from the scope of the invention.

What is claimed is:

1. An apparatus, comprising,
a substrate having a surface;
an organic field-effect transistor located adjacent said surface of said substrate, said transistor comprising a gate, a channel, a source electrode, and a drain electrode; and
wherein said channel comprises a densified layer of organic molecules with conjugated multiple bonds, axes of said organic molecules being oriented substantially normal to said surface.

2. The apparatus of claim 1, wherein said densified layer of organic molecules has a surface density of at least about 7 molecules/nm$^2$.

3. The apparatus of claim 1, wherein said densified layer is defined by said organic molecules having an average separation of less than about 3.8 Angstroms.

4. The apparatus of claim 1, wherein said densified layer is defined by said organic molecules having a uniform orientation that provides a polarization ratio of greater than about 1.

5. The apparatus of claim 4, wherein said uniform orientation is substantially coincident in a direction of current flow between said source and drain electrodes.

6. The apparatus of claim 1, wherein said substrate comprises an elastomer, wherein said elastomer has a glass transition temperature ($T_G$) of less than about 30° C.

7. The apparatus of claim 6, wherein said elastomer is an alkyl-substituted polysiloxane.

8. The apparatus as recited in claim 6, wherein said organic molecules have substantially coplanar aromatic groups.

9. The apparatus as recited in claim 1, wherein said organic molecules are linear organic molecules.

10. The apparatus as recited in claim 1, wherein said organic molecules are covalently bonded to said surface.

11. The apparatus as recited in claim 1, wherein said channel has a field effect mobility of at least about $10^{-4}$ cm$^2$ V$^{-1}$ s$^{-1}$.

* * * * *